US011380560B2

(12) United States Patent
Lee et al.

(10) Patent No.: US 11,380,560 B2
(45) Date of Patent: Jul. 5, 2022

(54) APPARATUS AND METHOD FOR PROCESSING SUBSTRATE (71) Applicant: SEMES CO., LTD., Chungcheongnam-do (KR)

(72) Inventors: Ki Seung Lee, Cheonan-si (KR); Choongki Min, Cheonan-si (KR); Soo Hyun Cho, Cheonan-si (KR); Okseong Lee, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 276 days.

(21) Appl. No.: 16/396,982

(22) Filed: Apr. 29, 2019

(65) Prior Publication Data
US 2019/0341274 A1 Nov. 7, 2019

(30) Foreign Application Priority Data

May 3, 2018 (KR) ........................ 10-2018-0051083

(51) Int. Cl.
  *H01L 21/67* (2006.01)
  *H01L 21/677* (2006.01)
  *H01L 21/687* (2006.01)
(52) U.S. Cl.
  CPC .. *H01L 21/67023* (2013.01); *H01L 21/67739* (2013.01); *H01L 21/68707* (2013.01)
(58) Field of Classification Search
  CPC ......... H01L 21/67023; H01L 21/68707; H01L 21/67739; H01L 21/67178;
  (Continued)

(56) References Cited

U.S. PATENT DOCUMENTS

2008/0037013 A1* 2/2008 Yamamoto .......... G03F 7/70341
356/237.2
2012/0227768 A1* 9/2012 Morita .............. H01L 21/67051
134/18
(Continued)

FOREIGN PATENT DOCUMENTS

JP         09289145 A       11/1997
JP       2003179041 A        6/2003
(Continued)

*Primary Examiner* — Alexander Markoff
(74) *Attorney, Agent, or Firm* — Li & Cai Intellectual Property (USA) Office (57) ABSTRACT The inventive concept relates to an apparatus and method for forming a film on a substrate by spin coating. The apparatus includes liquid dispensing units that dispense processing liquids to form liquid films on the first and second substrates, respectively, air-flow supply units that form downward air flows in the first and second spaces, respectively, and a controller that controls the liquid dispensing units and the air-flow supply units. Each of the liquid dispensing units includes a pre-treatment nozzle that dispenses a pre-treatment liquid and a coating solution nozzle that dispenses a coating solution onto a corresponding one of the first and second substrates. The controller controls the liquid dispensing units to dispense the pre-treatment liquids and thereafter the coating solutions onto the first and second substrates and adjusts supply states of the downward air flows according to amounts of the pre-treatment liquids dispensed.

4 Claims, 9 Drawing Sheets (58) Field of Classification Search
CPC ......... H01L 21/67748; H01L 21/67051; H01L 21/6715; H01L 21/02282; H01L 21/02307; G03F 7/16
See application file for complete search history.

(56) References Cited

U.S. PATENT DOCUMENTS

| | | | | |
|---|---|---|---|---|
| 2013/0233360 | A1* | 9/2013 | Egashira | B08B 3/024 |
| | | | | 134/153 |
| 2014/0030423 | A1* | 1/2014 | Kubota | B05C 11/08 |
| | | | | 427/8 |
| 2014/0261172 | A1* | 9/2014 | Ito | H01L 21/67178 |
| | | | | 118/712 |
| 2015/0125793 | A1* | 5/2015 | Yoshihara | G03F 7/16 |
| | | | | 430/270.1 |
| 2015/0251211 | A1* | 9/2015 | Tachibana | H01L 21/68742 |
| | | | | 118/704 |
| 2016/0124438 | A1* | 5/2016 | Minamida | H01L 21/67017 |
| | | | | 137/1 |
| 2016/0126112 | A1* | 5/2016 | Minamida | H01L 21/67017 |
| | | | | 134/57 R |
| 2018/0047559 | A1* | 2/2018 | Kamiya | H01L 21/68764 |
| 2018/0068873 | A1* | 3/2018 | Minamida | H01L 21/67017 |
| 2019/0115231 | A1* | 4/2019 | Lee | H01L 21/67126 |
| 2019/0139791 | A1* | 5/2019 | Kiyose | H01L 21/67253 |
| 2020/0050109 | A1* | 2/2020 | Ho | G03F 7/168 |
| 2020/0335324 | A1* | 10/2020 | Kamiya | H01L 21/67051 |

FOREIGN PATENT DOCUMENTS

| | | |
|---|---|---|
| KR | 1020100092906 A | 8/2010 |
| KR | 1020100100640 A | 9/2010 |
| KR | 1020160117824 A | 10/2016 |
| KR | 10-2017-0051364 A | 5/2017 |
| KR | 10-2017-0070610 A | 6/2017 |
| KR | 1020180004362 A | 1/2018 |
| KR | 10-1853376 B | 4/2018 |

* cited by examiner

APPARATUS AND METHOD FOR PROCESSING SUBSTRATE

CROSS-REFERENCE TO RELATED APPLICATIONS

A claim for priority under 35 U.S.C. § 119 is made to Korean Patent Application No. 10-2018-0051083 filed on May 3, 2018, in the Korean Intellectual Property Office, the entire contents of which are hereby incorporated by reference.

BACKGROUND

Embodiments of the inventive concept described herein relate to an apparatus and method for forming a liquid film on a substrate, and more particularly, relate to an apparatus and method for forming a film on a substrate by spin coating.

Various processes, such as cleaning, deposition, photolithography, etching, ion implantation, and the like, are performed to manufacture semiconductor devices. Among these processes, the photolithography process includes a process of forming a liquid film, such as a photoresist film, on a substrate.

In the liquid-film forming process, the liquid film is formed by applying a coating solution to the substrate. The coating solution is dispensed after a pre-treatment liquid is dispensed onto the substrate. The pre-treatment liquid for improving adhesion of the coating solution to the surface of the substrate is dispensed onto the substrate before the coating solution. The coating solution, which is a volatile material, may volatilize to contaminate surrounding devices while the liquid-film forming process is being performed. Due to this, a downward flow of air is formed in the space in which the liquid-film forming process is performed.

However, the downward air flow affects the thickness of the liquid film. Due to this, after a liquid-film forming apparatus is set up, the downward air flow has a constant supply state and is varied in view of the difference in pressure between the liquid-film forming apparatus and a surrounding chamber.

Accordingly, the thickness of the liquid film is varied depending on the space in which the substrate is processed, and it is difficult to vary the supply state of the downward air flow to correspond to the liquid-film forming process.

SUMMARY

Embodiments of the inventive concept provide an apparatus and method for uniformly adjusting the thickness of a liquid film formed on a substrate.

Embodiments of the inventive concept provide an apparatus and method for varying a supply state of a downward air flow to correspond to a liquid-film forming process.

Embodiments of the inventive concept provide an apparatus and method for forming different types of liquid films to the same thickness on a plurality of substrates.

According to an exemplary embodiment, an apparatus for forming a liquid film on a substrate includes a first process chamber having a first space in which a first substrate is processed, a second process chamber having a second space in which a second substrate is processed, liquid dispensing units that are provided in the first and second process chambers and that dispense processing liquids to form liquid films on the first and second substrates, respectively, air-flow supply units that are provided in the first and second process chambers and that form downward air flows in the first and second spaces, respectively, and a controller that controls the liquid dispensing units and the air-flow supply units. Each of the liquid dispensing units includes a pre-treatment nozzle that dispenses a pre-treatment liquid and a coating solution nozzle that dispenses a coating solution onto a corresponding one of the first and second substrates. The controller controls the liquid dispensing units to dispense the pre-treatment liquids and thereafter the coating solutions onto the first and second substrates and adjusts supply states of the downward air flows according to amounts of the pre-treatment liquids dispensed.

A first amount of pre-treatment liquid may be dispensed onto the first substrate, and a downward air flow with a first speed may be formed in the first space. A second amount of pre-treatment liquid may be dispensed onto the second substrate, and a downward air flow with a second speed may be formed in the second space. The first amount may be greater than the second amount, and the first speed may be lower than the second speed.

The pre-treatment liquids may include a solvent, and the coating solutions dispensed onto the first and second substrates may be different types of liquids.

Each of the air-flow supply units may include an air-flow supply line connected to a ceiling surface of a corresponding one of the first and second process chambers and a fan installed in the air-flow supply line. The controller may control rotational speeds of the fans to adjust the supply states of the downward air flows.

According to an exemplary embodiment, an apparatus for forming a liquid film on a substrate includes a housing, a processing vessel located in the housing and having a processing space therein, a substrate support unit that supports and rotates the substrate in the processing space, an air-flow supply unit that is installed in the housing and that forms a downward air flow in the processing space, a liquid dispensing unit that dispenses a processing liquid to form the liquid film on the substrate supported on the substrate support unit, and a controller that controls the liquid dispensing unit and the air-flow supply unit. The controller controls the liquid dispensing unit to dispense a pre-treatment liquid and thereafter a coating solution onto the substrate supported on the substrate support unit and adjusts a supply state of the downward air flow according to an amount of the pre-treatment liquid dispensed.

The controller may form a downward air flow with a first speed in the processing space when a first amount of pre-treatment liquid is dispensed onto the substrate and may form a downward air flow with a second speed in the processing space when a second amount of pre-treatment liquid is dispensed onto the substrate. The first amount may be greater than the second amount, and the first speed may be lower than the second speed.

According to an exemplary embodiment, a method for forming a liquid film on a substrate in a processing space in which a downward air flow is formed includes a first process step of forming a liquid film on a first substrate and a second process step of forming a liquid film on a second substrate. The first process step includes a first pre-treatment step of dispensing a pre-treatment liquid onto the first substrate and a first coating step of coating the first substrate with a first coating solution. The second process step includes a second pre-treatment step of dispensing the pre-treatment liquid onto the second substrate and a second coating step of coating the second substrate with a second coating solution. A supply state of the downward air flow is adjusted according to an amount of the pre-treatment liquid dispensed.

The supply state of the downward air flow may be adjusted in the first coating step and the second coating step. The supply state of the downward air flow may remain at a constant speed in the first pre-treatment step and the second pre-treatment step.

The pre-treatment liquid may be dispensed to a first amount in the first pre-treatment step, a controller forms a downward air flow with a first speed in the processing space when the first amount of pre-treatment liquid is dispensed onto the substrate, the pre-treatment liquid may be dispensed to a second amount in the second pre-treatment step, and the controller forms a downward air flow with a second speed in the processing space when the second amount of pre-treatment liquid is dispensed onto the substrate The first amount may be greater than the second amount, and the first speed may be lower than the second speed. The pre-treatment liquid may include a solvent, and the first and second coating solutions may include photoresist. The supply state of the downward air flow may be adjusted by a rotational speed of a fan installed above the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in more detail with reference to the accompanying drawings. The inventive concept may, however, be embodied in different forms and should not be constructed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Figure 1:
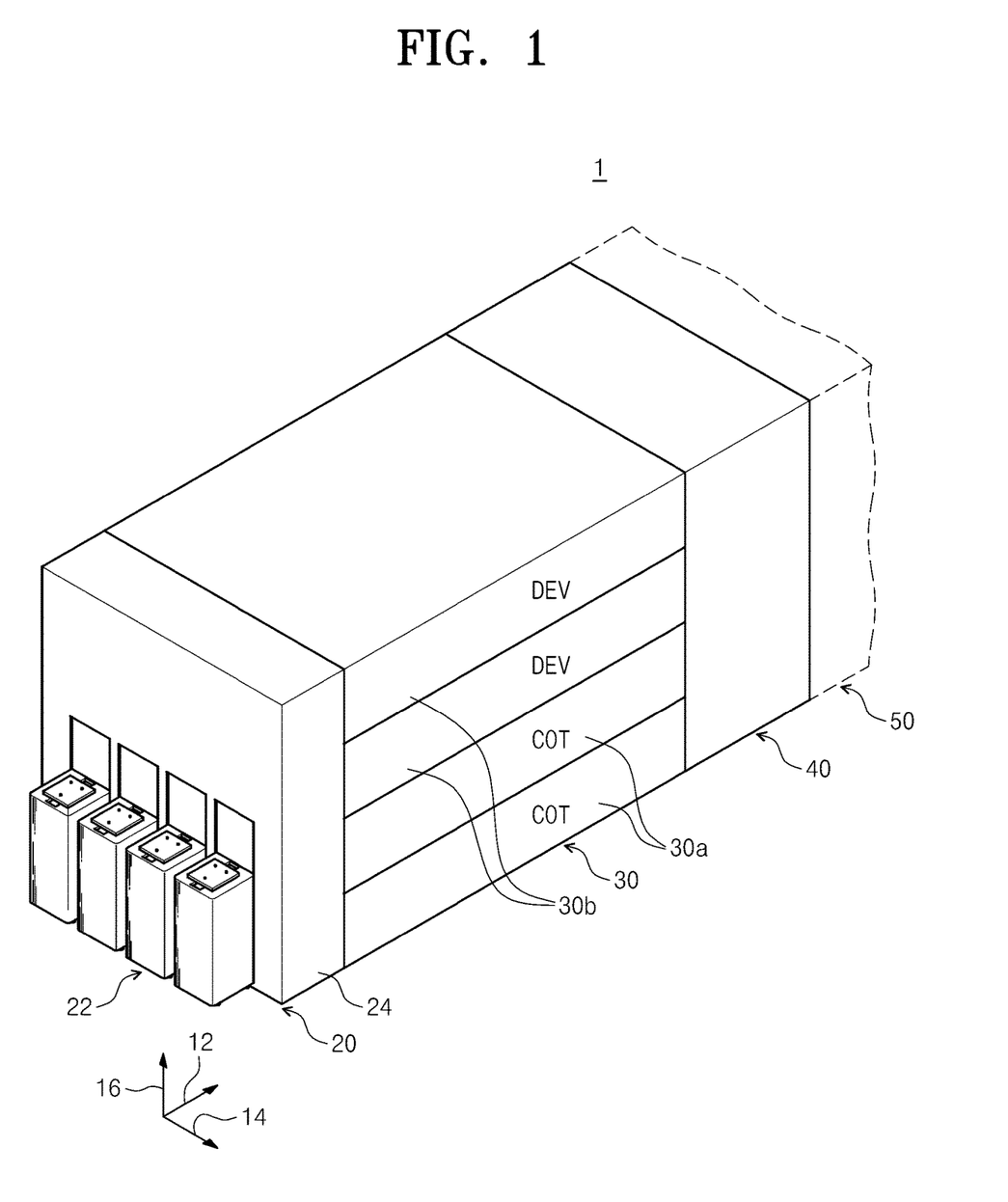
FIG. 1 is a schematic perspective view illustrating a substrate processing apparatus according to an embodiment of the inventive concept.
Figure 2:
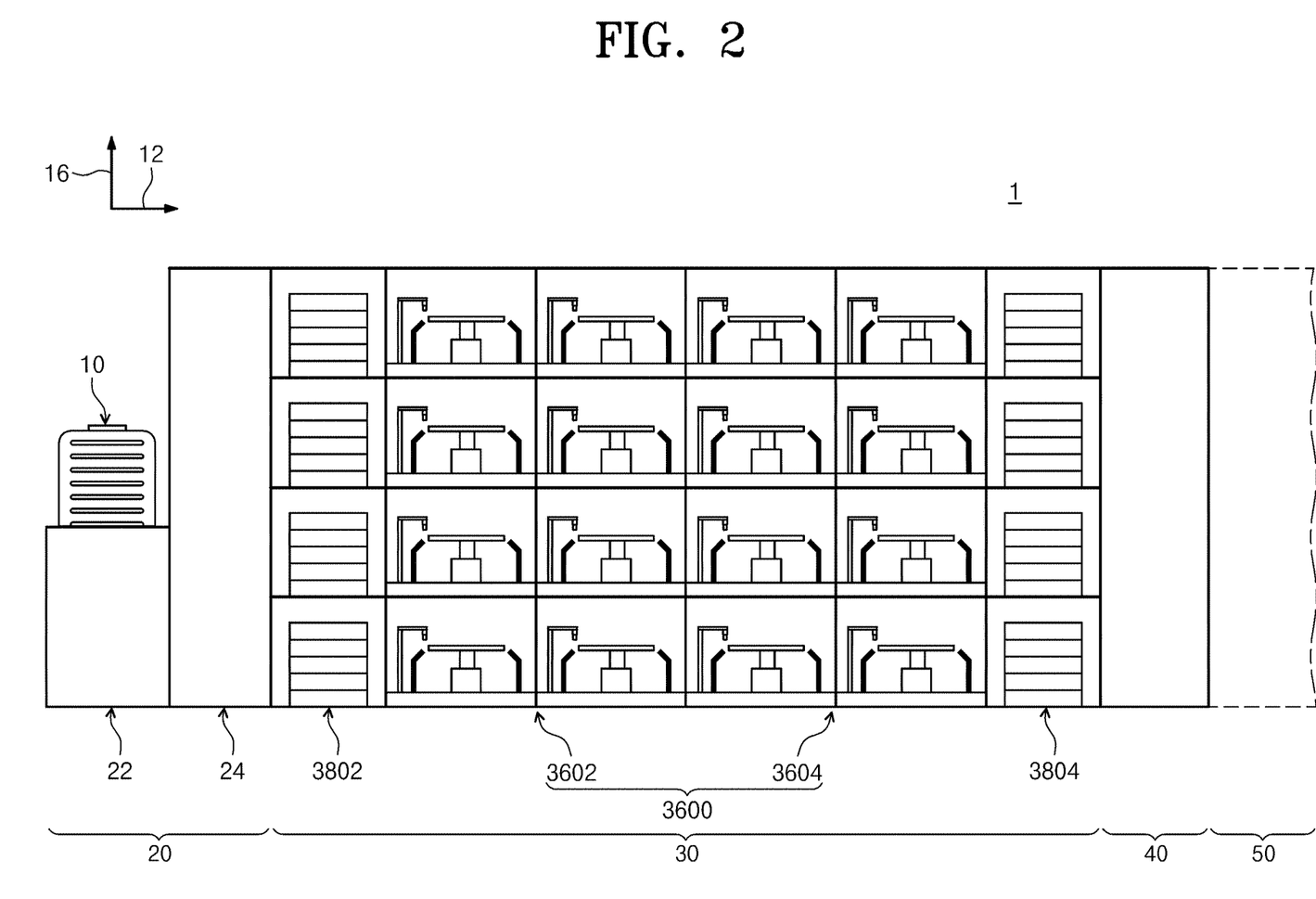
FIG. 2 is a sectional view of the substrate processing apparatus illustrating coating blocks and developing blocks of FIG. 1.
Figure 3:
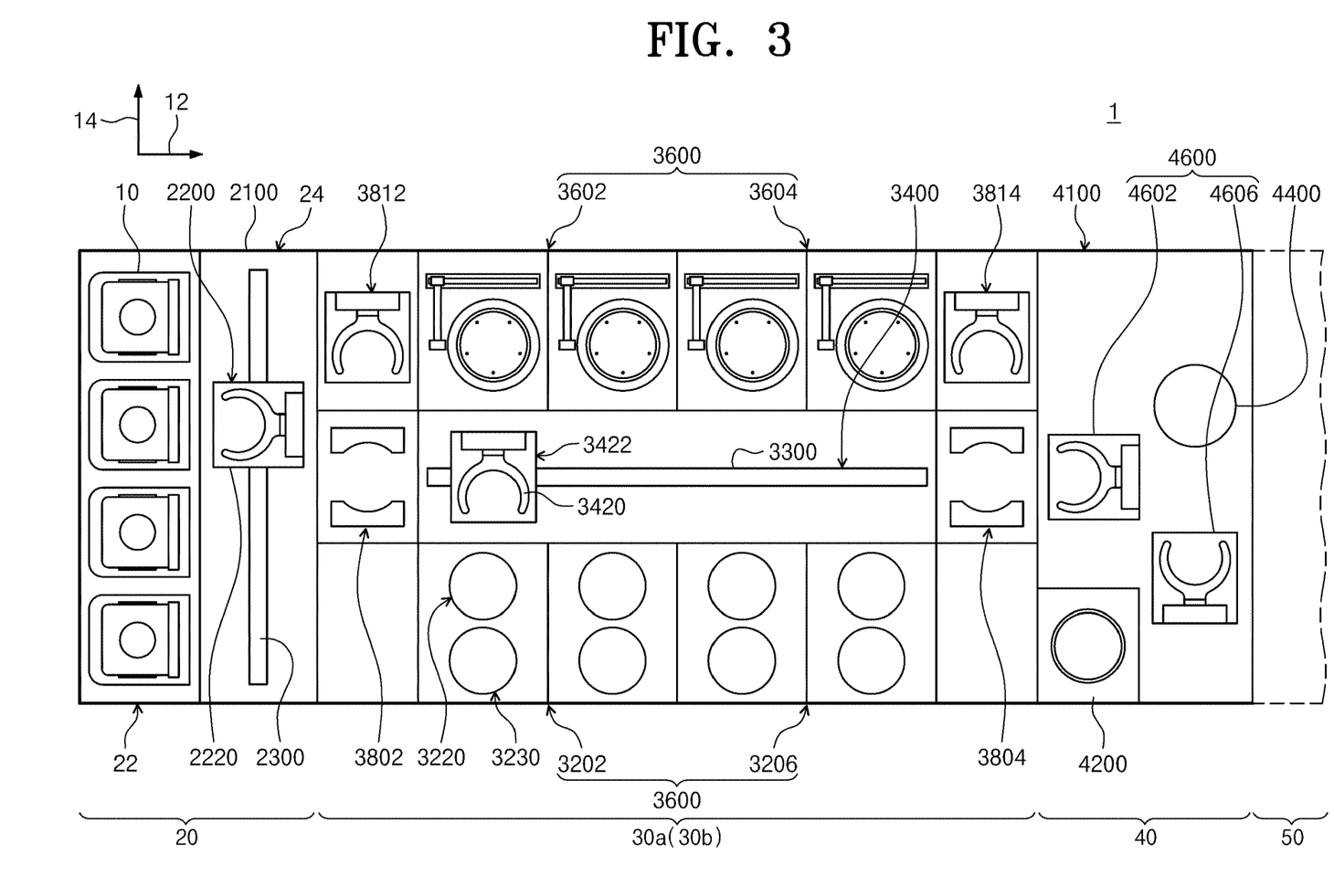
FIG. 3 is a plan view illustrating the substrate processing apparatus of FIG. 1.

FIG. 1 is a schematic perspective view illustrating a substrate processing apparatus according to an embodiment of the inventive concept. FIG. 2 is a sectional view of the substrate processing apparatus illustrating coating blocks and developing blocks of FIG. 1. FIG. 3 is a plan view illustrating the substrate processing apparatus of FIG. 1.

Referring to FIGS. 1 to 3, the substrate processing apparatus 1 includes an index module 20, a processing module 30, and an interface module 40. According to an embodiment, the index module 20, the processing module 30, and the interface module 40 are sequentially arranged in a row. Hereinafter, the direction in which the index module 20, the processing module 30, and the interface module 40 are arranged is referred to as a first direction 12, a direction perpendicular to the first direction 12 when viewed from above is referred to as a second direction 14, and a direction perpendicular to both the first direction 12 and the second direction 14 is referred to as a third direction 16.

The index module 20 transfers substrates W received in containers 10 to the processing module 30 and places processed substrates W in the containers 10. The long side of the index module 20 is oriented in the second direction 14. The index module 20 has load ports 22 and an index frame 24. The load ports 22 are located on the opposite side to the processing module 30 with respect to the index frame 24. The containers 10 having the substrates W received therein are placed on the load ports 22. The plurality of load ports 22 may be arranged along the second direction 14.

Airtight containers 10 such as front open unified pods (FOUPs) may be used as the containers 10. The containers 10 may be placed on the load ports 22 by a transfer means (not illustrated), such as an overhead transfer, an overhead conveyor, or an automatic guided vehicle, or a worker.

The index frame 24 has an index robot 2200 inside. A guide rail 2300, the long side of which is oriented in the second direction 14, is provided in the index frame 24, and the index robot 2200 is movable on the guide rail 2300. The index robot 2200 includes a hand 2220 on which a substrate W is placed, and the hand 2220 is movable forward and backward, rotatable about an axis oriented in the third direction 16, and movable along the third direction 16.

The processing module 30 performs a coating process and a developing process on a substrate W. The processing module 30 has coating blocks 30a and developing blocks 30b. Each of the coating blocks 30a performs a coating process on a substrate W, and each of the developing blocks 30b performs a developing process on the substrates W. The coating blocks 30a are stacked on each other. The developing blocks 30b are stacked on each other. According to the embodiment of FIG. 3, two coating blocks 30a and two developing block 30b are provided. The coating blocks 30a may be disposed under the developing blocks 30b. According to an embodiment, the two coating blocks 30a may perform the same process and may have the same structure. Furthermore, the two developing blocks 30b may perform the same process and may have the same structure.

Each of the coating blocks 30a has heat treatment chambers 3200, a transfer chamber 3400, liquid processing chambers 3600, and buffer chambers 3800. The heat treatment chambers 3200 perform a heat treatment process on a substrates W. The heat treatment process may include a cooling process and a heating process. The liquid processing chambers 3600 form a liquid film on a substrate W by dispensing a liquid onto the substrate W. The liquid film may be a photoresist film or an anti-reflection film. The transfer chamber 3400 transfers a substrate W between the heat treatment chambers 3200 and the liquid processing chambers 3600 in the coating block 30a.

The longitudinal direction of the transfer chamber 3400 is parallel to the first direction 12. The transfer chamber 3400 has a transfer robot 3422 inside. The transfer robot 3422 transfers a substrate W between the heat treatment chambers 3200, the liquid processing chambers 3600, and the buffer chambers 3800. According to an embodiment, the transfer robot 3422 has a hand 3420 on which a substrate W is placed, and the hand 3420 is movable forward and backward, rotatable about an axis oriented in the third direction 16, and movable along the third direction 16. A guide rail 3300, the longitudinal direction of which is parallel to the first direction 12, is provided in the transfer chamber 3400, and the transfer robot 3422 is movable on the guide rail 3300.

Figure 4:
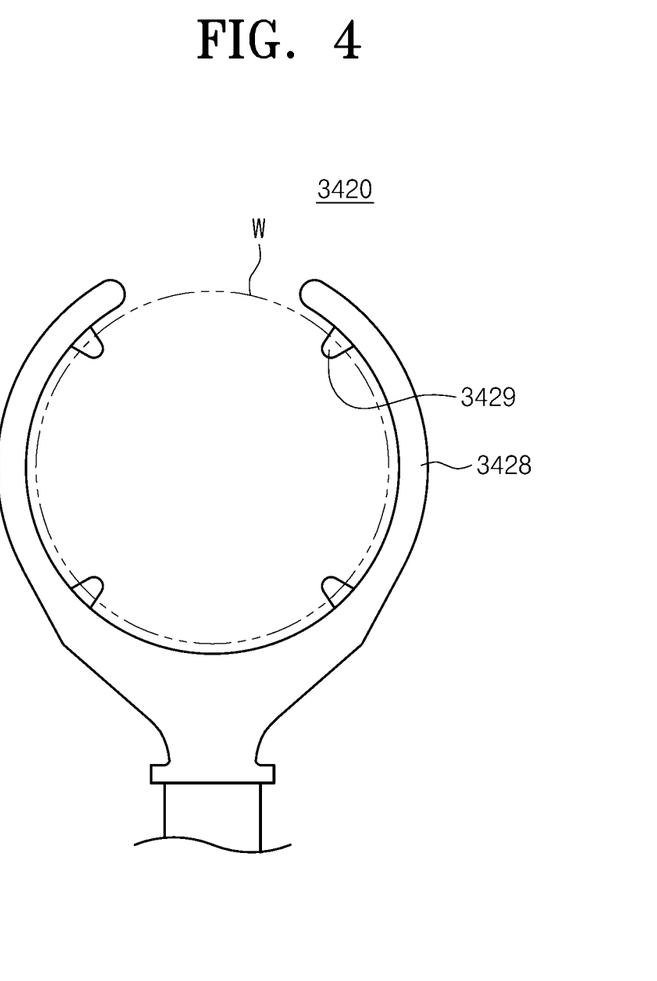
FIG. 4 is a view illustrating one example of a hand of a transfer robot of FIG. 3.

FIG. 4 is a view illustrating one example of the hand of the transfer robot of FIG. 3. Referring to FIG. 4, the hand 3420 has a base 3428 and support protrusions 3429. The base 3428 may have an annular ring shape, the circumference of which is partially curved. The base 3428 has an inner diameter larger than the diameter of a substrate W. The support protrusions 3429 extend inward from the base 3428. The support protrusions 3439 support the edge region of the substrate W. According to an embodiment, four support protrusions 3429 may be provided at constant intervals.

Figure 5:
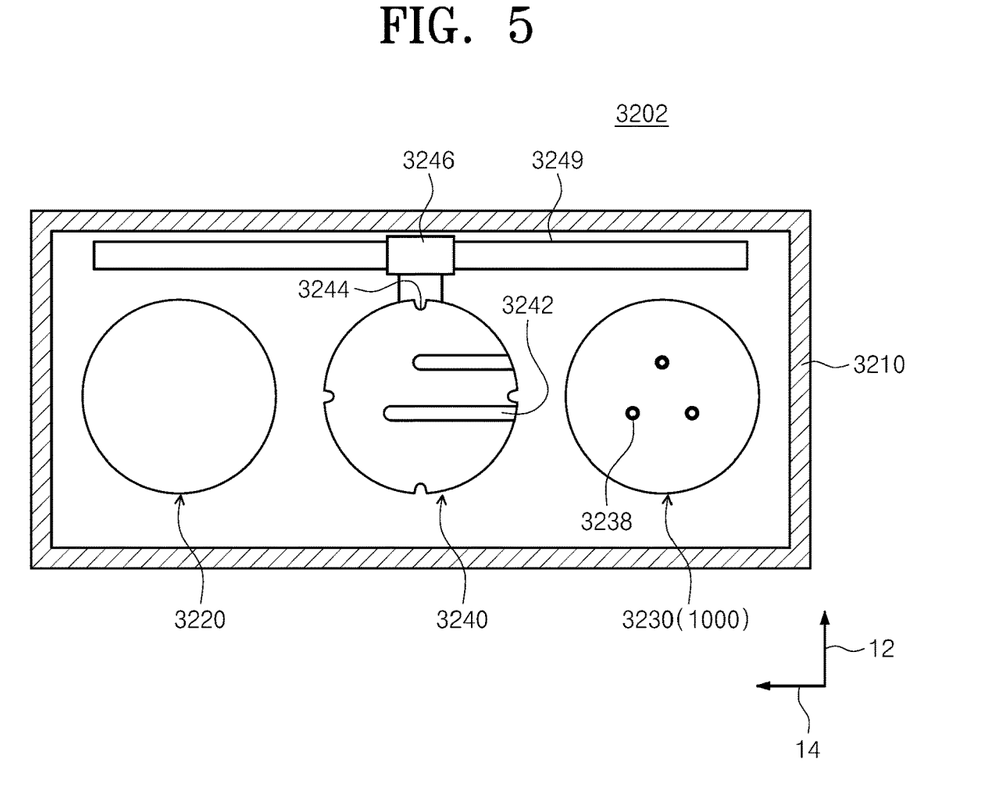
FIG. 5 is a schematic plan view illustrating one example of heat treatment chambers of FIG. 3.

The plurality of heat treatment chambers 3200 are provided. Referring to FIGS. 4 and 5, the heat treatment chambers 3200 are arranged along the first direction 12. The heat treatment chambers 3200 are located on one side of the transfer chamber 3400.

Figure 6:
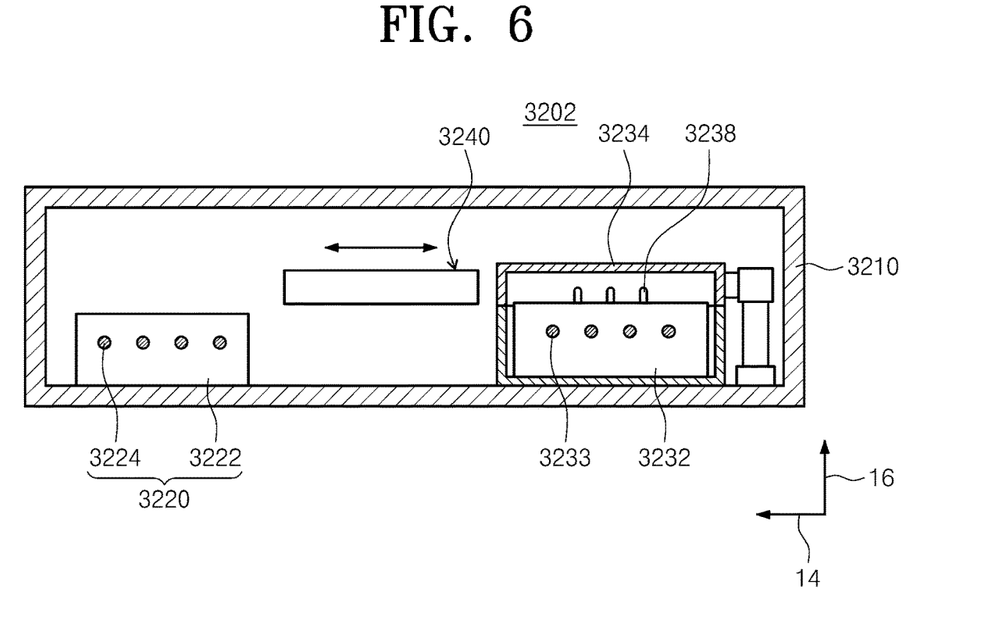
FIG. 6 is a front view illustrating a heat treatment chamber of FIG. 5.

FIG. 5 is a schematic plan view illustrating one example of the heat treatment chambers of FIG. 3, and FIG. 6 is a front view illustrating a heat treatment chamber of FIG. 5. Referring to FIGS. 5 and 6, the heat treatment chamber 3200 has a housing 3210, a cooling unit 3220, a heating unit 3230, and a transfer plate 3240.

The housing 3210 has a substantially rectangular parallelepiped shape. The housing 3210 has an entrance (not illustrated) formed in a sidewall thereof, through which a substrate W is placed in or extracted from the housing 3210. The entrance may remain open. Alternatively, a door (not illustrated) for opening or closing the entrance may be provided. The cooling unit 3220, the heating unit 3230, and the transfer plate 3240 are provided in the housing 3210. The cooling unit 3220 and the heating unit 3230 are provided side by side along the second direction 14. According to an embodiment, the cooling unit 3220 may be located closer to the transfer chamber 3400 than the heating unit 3230.

The cooling unit 3220 has a cooling plate 3222. The cooling plate 3222 may have a substantially circular shape when viewed from above. The cooling plate 3222 has a cooling member 3224 therein. According to an embodiment, the cooling member 3224 may be formed in the cooling plate 3222 and may serve as a passage through which a cooling fluid flows.

The heating unit 3230 has a heating plate 3232, a cover 3234, and a heater 3233. The heating plate 3232 has a substantially circular shape when viewed from above. The heating plate 3232 has a larger diameter than the substrate W. The heater 3233 is installed in the heating plate 3232. The heater 3233 may be a resistance heating element to which electric current is applied. The heating plate 3232 has lift pins 3238 that are vertically movable along the third direction 16. The lift pins 3238 receive a substrate W from a transfer unit outside the heating unit 3230 and lay the substrate W down on the heating plate 3232, or raise the substrate W off the heating plate 3232 and transfer the substrate W to the transfer unit outside the heating unit 3230. According to an embodiment, three lift pins 3238 may be provided. The cover 3234 has a space therein, which is open at the bottom. The cover 3234 is located over the heating plate 3232 and vertically moved by an actuator 3236. When the cover 3234 is brought into contact with the heating plate 3232, the space surrounded by the cover 3234 and the heating plate 3232 serves as a heating space in which the substrate W is heated.

The transfer plate 3240 has a substantially circular plate shape and has a diameter corresponding to the substrate W. The transfer plate 3240 has notches 3244 formed at the edge thereof. The notches 3244 may have a shape corresponding to the protrusions 3429 formed on the hand 3420 of the transfer robot 3422 described above. Furthermore, as many notches 3244 as the protrusions 3429 formed on the hand 3420 are formed in positions corresponding to the protrusions 3429. The substrate W is transferred between the hand 3420 and the transfer plate 3240 when the vertical positions of the hand 3420 and the transfer plate 3240 aligned with each other in the vertical direction are changed. The transfer plate 3240 may be mounted on a guide rail 3249 and may be moved between a first region 3212 and a second region 3214 along the guide rail 3249 by an actuator 3246. A plurality of guide grooves 3242 in a slit shape are formed in the transfer plate 3240. The guide grooves 3242 extend inward from the edge of the transfer plate 3240. The long sides of the guide grooves 3242 are oriented in the second direction 14, and the guide grooves 3242 are spaced apart from each other along the first direction 12. The guide grooves 3242 prevent the transfer plate 3240 and the lift pins 3238 from interfering with each other when the substrate W is transferred between the transfer plate 3240 and the heating unit 3230.

The substrate W is heated while the substrate W is directly placed on the heating plate 3232. The substrate W is cooled while the transfer plate 3240 on which the substrate W is placed is brought into contact with the cooling plate 3222. The transfer plate 3240 is made of a material with a high heat transfer rate for efficient heat transfer between the cooling plate 3222 and the substrate W. According to an embodiment, the transfer plate 3240 may be made of metal.

Heating units 3230 provided in some of the heat treatment chambers 3200 may improve adhesion of photoresist to a substrate W by supplying a gas while heating the substrate W. According to an embodiment, the gas may be a hexamethyldisilane gas.

The plurality of liquid processing chambers 3600 are provided. Some of the liquid processing chambers 3600 may be stacked on each other. The liquid processing chambers 3600 are disposed on one side of the transfer chamber 3400. The liquid processing chambers 3600 are arranged side by side along the first direction 12. Some of the liquid processing chambers 3600 are located adjacent to the index module 20. Hereinafter, these liquid processing chambers are referred to as front liquid processing chambers 3602. Other liquid processing chambers 3600 are located adjacent to the interface module 40. Hereinafter, these liquid processing chambers are referred to as rear liquid processing chambers 3604.

The front liquid processing chambers 3602 apply a first liquid to a substrate W, and the rear liquid processing chambers 3604 apply a second liquid to the substrate W. The front liquid processing chambers 3602 and the rear liquid processing chambers 3604 have the same shape. The first liquid and the second liquid may be different types of liquids. According to an embodiment, the first liquid is an anti-reflection film, and the second liquid is photoresist. The photoresist may be applied to the substrate W coated with the anti-reflection film. Alternatively, the first liquid may be photoresist, and the second liquid may be an anti-reflection film. In this case, the anti-reflection film may be applied to the substrate W coated with the photoresist. In another case, the first liquid and the second liquid may be of the same type. Both the first liquid and the second liquid may be photoresist.

Figure 7:
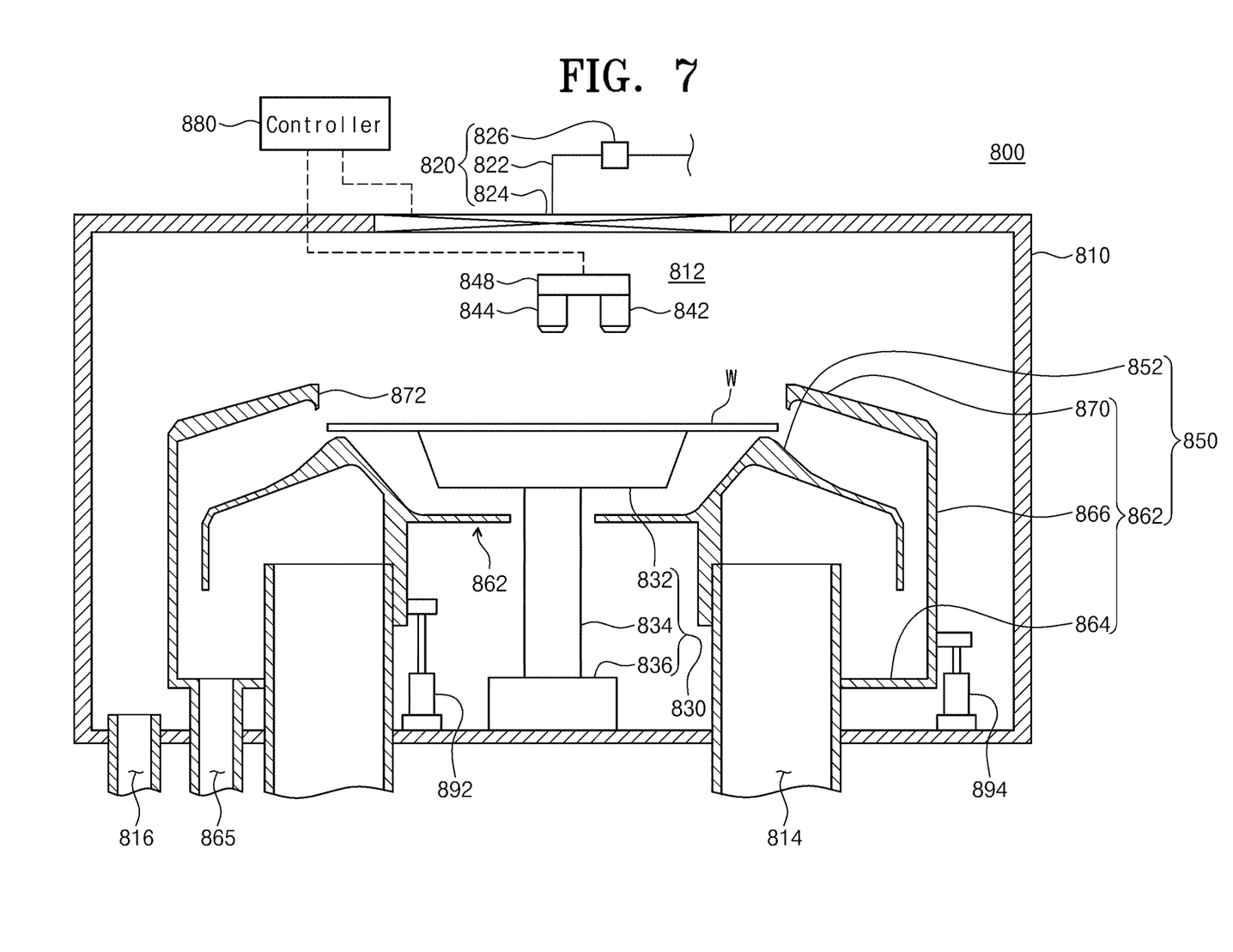
FIG. 7 is a schematic sectional view illustrating one example of liquid processing chambers of FIG. 3.

Next, the rear liquid processing chambers 3604 will be described. FIG. 7 is a schematic view illustrating one example of the liquid processing chambers of FIG. 3. Referring to FIG. 7, the rear liquid processing chamber 3604 includes a housing 810, an air-flow supply unit 820, a substrate support unit 830, a processing vessel 850, a lifting unit 890, a liquid dispensing unit 840, and a controller 880.

The housing 810 has the shape of a rectangular parallelepiped container with a space 812 therein. The housing 810 has an opening (not illustrated) that is formed at one side thereof. The opening functions as an entrance through which a substrate W is extracted from or placed in the housing 810. A door is provided in the opening to open or close the opening. When substrate processing is performed, the door closes the opening to seal the inner space 812 of the housing 810 from the outside. An inner exhaust port 814 and an outer exhaust port 816 are formed in a lower wall of the housing 810. An air flow formed in the housing 810 is discharged to the outside through the inner exhaust port 814 and the outer exhaust port 816. According to an embodiment, an air flow inside the processing vessel 850 may be discharged through the inner exhaust port 814, and an air flow outside the processing vessel 850 may be discharged through the outer exhaust port 816.

The air-flow supply unit 820 forms a downward flow of air in the inner space 812 of the housing 810. The air-flow supply unit 820 includes an air-flow supply line 822, a fan 824, and a filter 826. The air-flow supply line 822 is connected to the housing 810. The air-flow supply line 822 supplies outside air into the housing 810. The filter 826 filters the air supplied from the air-flow supply line 822. The filter 826 removes impurities contained in the air. The fan 824 is installed in an upper wall of the housing 810. The fan 824 is located in a central region of the upper wall of the housing 810. The fan 824 forms a downward flow of air in the inner space 812 of the housing 810. When the air is supplied from the air-flow supply line 822 to the fan 824, the fan 824 supplies the air downward. According to an embodiment, a supply state of the downward air flow may be adjusted by the rotational speed of the fan 824. The downward air flow may be supplied at a first speed or a second speed according to the rotation of the fan 824.

The air-flow supply unit 820 adjusts the supply state of the downward air flow to allow the pressure in the housing 810 to be lower than the pressure in the transfer chamber 3400 adjacent to the housing 810. That is, the downward air flow may have a maximum speed on a line where the housing 810 has a lower pressure than the transfer chamber 3400. The aim is to prevent fumes or particles generated in the process of processing the substrate W from being introduced into the transfer chamber 3400.

The substrate support unit 830 supports the substrate W in the inner space 812 of the housing 810. The substrate support unit 830 rotates the substrate W. The substrate support unit 830 includes a spin chuck 832, a rotary shaft 834, and an actuator 836. The spin chuck 832 functions as a substrate support member that supports the substrate W. The spin chuck 832 has a circular plate shape. The substrate W is placed on an upper surface of the spin chuck 832. The spin chuck 832 has a smaller diameter than the substrate W. According to an embodiment, the spin chuck 832 clamps the substrate W by vacuum pressure. Alternatively, the spin chuck 832 may be implemented with an electrostatic chuck that clamps the substrate W using an electrostatic attractive force. In another case, the spin chuck 832 may clamp the substrate W using a physical force.

The rotary shaft 834 and the actuator 836 function as rotation members for rotating the spin chuck 832. The rotary shaft 834 is located below the spin chuck 832 and supports the spin chuck 832. The rotary shaft 834 is arranged such that the long side thereof is oriented in the vertical direction. The rotary shaft 834 is rotatable about the central axis thereof. The actuator 836 provides a driving force to rotate the rotary shaft 834. For example, the actuator 836 may be a motor that varies the rotational speed of the rotary shaft 834.

The processing vessel 850 is located in the inner space 812 of the housing 810. The processing vessel 850 has a processing space therein. The processing vessel 850 has a cup shape that is open at the top thereof. The processing vessel 850 includes an inner cup 852 and an outer cup 862.

The inner cup 852 has a circular plate shape that surrounds the rotary shaft 834. The inner cup 852 is located to cover the inner exhaust port 814 when viewed from above. The inner cup 852 has an upper surface, the inner and outer regions of which are inclined at different angles when viewed from above. According to an embodiment, the outer region of the inner cup 852 is downwardly inclined away from the substrate support unit 830, and the inner region of the inner cup 852 is upwardly inclined away from the substrate support unit 830. The border between the outer region and the inner region of the inner cup 852 corresponds to a side end portion of the substrate W in the vertical direction. The outer region of the upper surface of the inner cup 852 is rounded. The outer region of the upper surface of the inner cup 852 is concave downward. The outer region of the upper surface of the inner cup 852 may serve as a region on which a processing liquid flows.

The outer cup 862 has a cup shape that surrounds the substrate support unit 830 and the inner cup 852. The outer cup 862 has a bottom wall 864, a sidewall 866, and an inclined top wall 870. The bottom wall 864 has a circular plate shape with an empty space. A recovery line 865 is formed on the bottom wall 864. The recovery line 865 is used to recover the processing liquid dispensed onto the substrate W. The processing liquid recovered by the recover line 865 may be reused through an external liquid regeneration system. The sidewall 866 has a cylindrical shape that surrounds the substrate support unit 830. The sidewall 866 vertically extends from a side end of the bottom wall 864. The sidewall 866 extends upward from the bottom wall 864.

The inclined top wall 870 extends from an upper end of the sidewall 866 toward the inside of the outer cup 862. The inclined top wall 870 becomes closer to the substrate support unit 830 from bottom to top. The inclined top wall 870 has a ring shape. An upper end of the inclined top wall 870 is located in a higher position than the substrate W supported on the substrate support unit 830.

The lifting unit 890 raises or lowers the inner cup 852 and the outer cup 862. The lifting unit 890 includes an inner actuating member 892 and an outer actuating member 894. The inner actuating member 892 raises or lowers the inner cup 852, and the outer actuating member 894 raises or lowers the outer cup 862.

Figure 8:
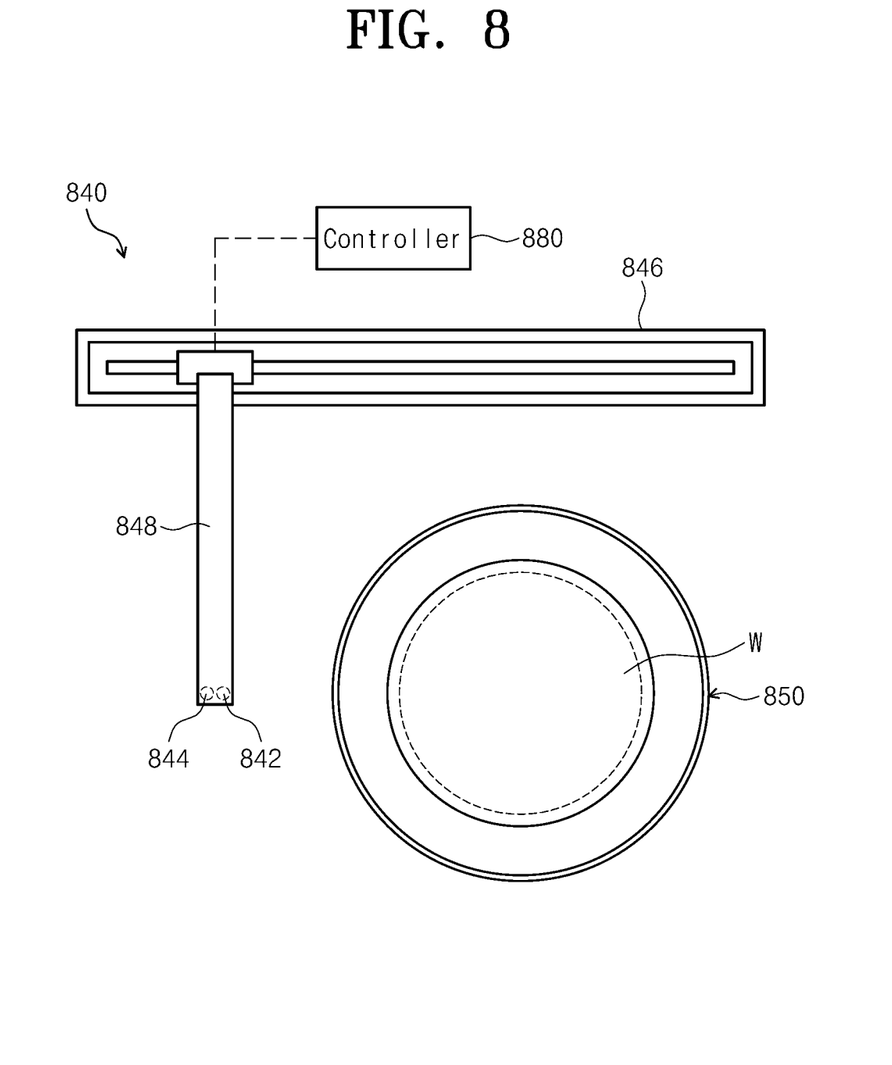
FIG. 8 is a plan view illustrating a liquid processing chamber of FIG. 7.

The liquid dispensing unit 840 dispenses a processing liquid onto the substrate W. According to an embodiment, the processing liquid includes a pre-treatment liquid and a coating solution. The liquid dispensing unit 840 includes a guide member 846, an arm 848, a pre-treatment nozzle 842, and a coating nozzle 844. The guide member 846 includes a guide rail 846 for horizontally moving the arm 848. The guide rail 846 is located on one side of the processing vessel 850. The long side of the guide rail 846 is oriented in the horizontal direction. According to an embodiment, the longitudinal direction of the guide rail 846 may be parallel to the first direction 12. The arm 848 is installed on the guide rail 846. The arm 848 may be moved by a linear motor inside the guide rail 846. The long side of the arm 848 is perpendicular to the guide rail 846 when viewed from above. One end of the arm 848 is mounted on the guide rail 846. The pre-treatment nozzle 842 and the coating nozzle 844 are installed on the bottom of an opposite end of the arm 848. The pre-treatment nozzle 842 and the coating nozzle 844 are arranged parallel to the longitudinal direction of the guide rail 846 when viewed from above. Alternatively, the arm 848 may be coupled to and rotated by a rotary shaft, the long side of which is oriented in the third direction 16.

The pre-treatment nozzle 842 dispenses the pre-treatment liquid onto the substrate W, and the coating nozzle 844 dispenses the coating solution onto the substrate W. For example, the pre-treatment liquid may be a liquid that is capable of improving adhesion of the coating solution to the surface of the substrate W. The pre-treatment liquid may be a liquid that is capable of changing the surface of the substrate W from a hydrophilic surface to a hydrophobic surface, or vice versa. The pre-treatment liquid may be a solvent, and the coating solution may be a light-sensitive material such as photoresist. The pre-treatment liquid may be thinner. The pre-treatment nozzle 842 receives the pre-treatment liquid from a pre-treatment liquid supply line. A first valve is installed in the pre-treatment liquid supply line and opens or closes the pre-treatment liquid supply line. The coating nozzle 844 receives the coating solution from a coating solution supply line. A second valve is installed in the coating solution supply line and opens or closes the coating solution supply line.

The pre-treatment nozzle 842 dispenses the pre-treatment liquid in a central position, and the coating nozzle 844 dispenses the coating solution between an eccentric position and the central position. The pre-treatment nozzle 842 and the coating nozzle 844 have a discharge opening directed vertically downward. Here, the central position is a position where the liquid is dispensed onto the center of the substrate W, and the eccentric position is a position where the liquid is dispensed onto a region spaced apart from the center of the substrate W. Alternatively, the discharge opening of the pre-treatment nozzle 842 may be downwardly inclined.

The controller 880 controls the liquid dispensing unit 840 and the air-flow supply unit 820. According to an embodiment, the controller 880 may control the liquid dispensing unit 840 and the air-flow supply unit 820 that are located in each of the rear liquid processing chambers 3604. The controller 880 may adjust a supply state of a downward air flow formed in the rear liquid processing chamber 3604, according to the amount of the pre-treatment liquid dispensed onto the substrate W.

According to an embodiment, when a first process of forming a first liquid film on a first substrate is performed in any one chamber (hereinafter, referred to as a first process chamber) among the plurality of rear liquid processing chambers 3604 and a second process of forming a second liquid film on a second substrate is performed in another chamber (hereinafter, referred to as a second process chamber), the controller 880 may differently adjust supply states of downward air flows formed in the first and second process chambers. The supply speeds of the downward air flows may be decreased with an increase in the amounts of pre-treatment liquids dispensed and may be increased with a decrease in the amounts of pre-treatment liquids dispensed. The supply speeds of the downward air flows may be adjusted by the rotational speed of the fan 824. Here, a coating solution for forming the first liquid film and a coating solution for forming the second liquid film may be different types of liquids. The amounts of pre-treatment liquids used in the first and second processes may differ from each other.

Figure 9:
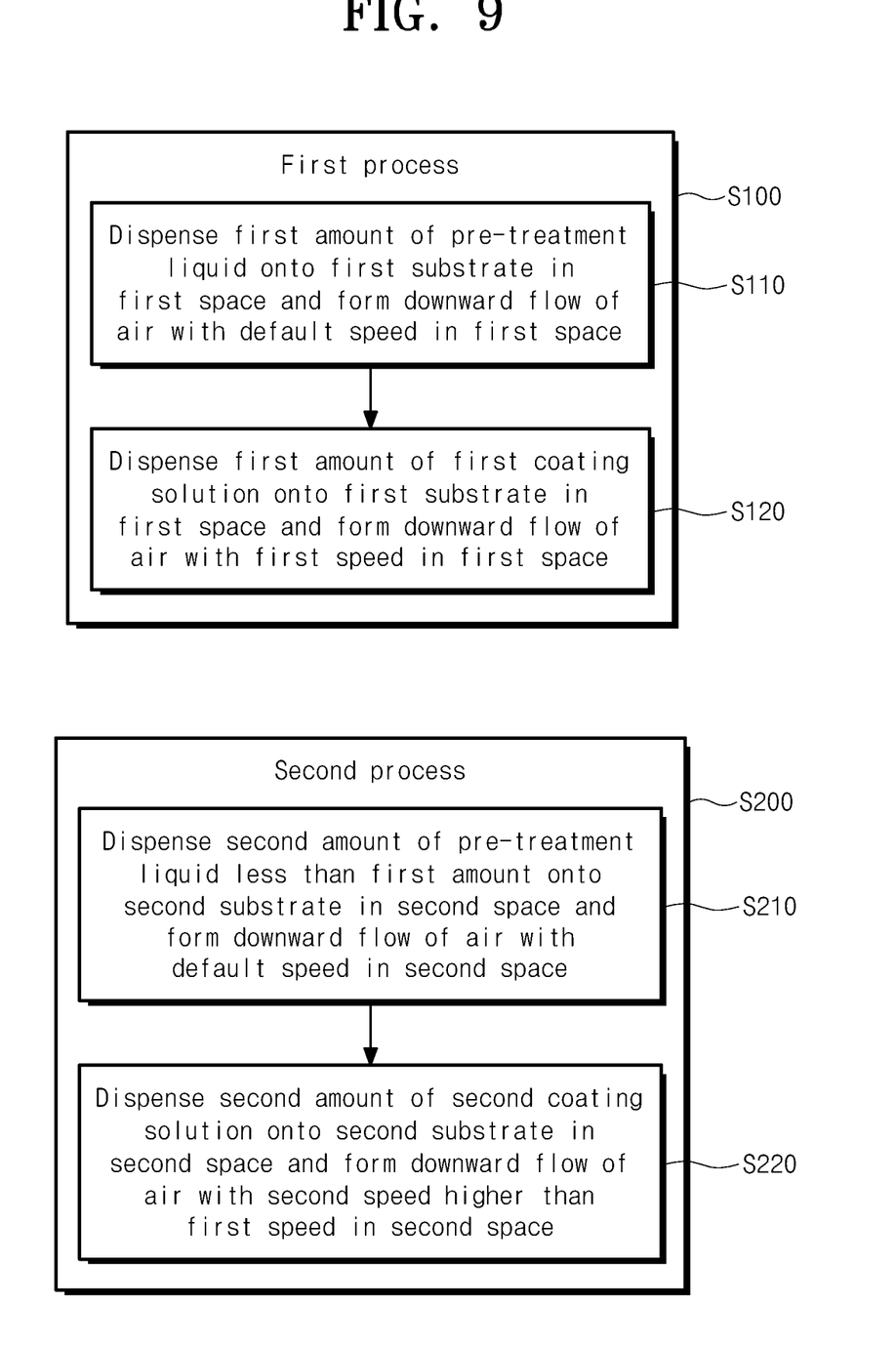
FIG. 9 is a flowchart illustrating a process of processing a first substrate and a second substrate in the apparatus of FIG. 7 (different substrates in different chambers)

Next, a method for processing substrates W using the above-described substrate processing apparatus will be described. FIG. 9 is a flowchart illustrating a process of processing a first substrate and a second substrate in the apparatus of FIG. 7. Referring to FIG. 9, first process S100 of forming a first liquid film on a first substrate is performed in a first space of a first process chamber, and second process S200 of forming a second liquid film on a second substrate is performed in a second space of a second process chamber.

In first process S100, first pre-treatment step S110 and first coating step S120 are performed in a serial order. In first pre-treatment step S110, the first substrate is supported on and rotated by the substrate support unit 830, and a first amount of pre-treatment liquid is dispensed onto the first substrate. In first pre-treatment step S110, a downward flow of air with a constant speed is formed in the first process chamber. When first pre-treatment step S110 is completed, first coating step S120 is performed. In first coating step S120, a first coating solution is dispensed onto the first substrate. During first coating step S120, the supply state of the downward air flow is adjusted according to the amount of the pre-treatment liquid dispensed in first pre-treatment step S110. Accordingly, the first liquid film is formed on the first substrate.

In second process S200, second pre-treatment step S210 and second coating step S220 are performed in a serial order. In second pre-treatment step S210, the second substrate is supported on and rotated by the substrate support unit 830, and a second amount of pre-treatment liquid, which is different from the first amount, is dispensed onto the second substrate. In second pre-treatment step S210, a downward flow of air with a constant speed is formed in the second process chamber. The speed of the downward air flow in second pre-treatment step S210 is the same as that in first pre-treatment step S110. For example, the speeds of the downward air flows in first and second pre-treatment steps S110 and S210 may be an initially-set default speed. When second pre-treatment step S210 is completed, second coating step S220 is performed. In second coating step S220, a second coating solution is dispensed onto the second substrate. During second coating step S220, the supply state of the downward air flow is adjusted according to the amount of the pre-treatment liquid dispensed in second pre-treatment step S210. Accordingly, the second liquid film is formed on the second substrate.

The first amount of pre-treatment liquid is dispensed in first process S100, and the second amount of pre-treatment liquid is dispensed in second process S200. The reason is because the first coating solution and the second coating solution are different types of liquids. Accordingly, a downward air flow with a first speed is formed in first coating step S120 of first process S100, and a downward air flow with a second speed is formed in second coating step S220 of second process S200.

In the above-described embodiment, the supply states of the downward air flows are adjusted according to the amounts of the pre-treatment liquids dispensed. This is closely related to effects of the pre-treatment liquids on the thicknesses of the liquid films. A fluctuation in the thickness of a liquid film formed on a substrate W is increased with an increase in the amount of pre-treatment liquid dispensed. The thickness of the liquid film is varied according to a supply state of a downward air flow. Accordingly, the thickness of the liquid film may be uniformly adjusted by adjusting the supply state of the downward air flow according to the amount of pre-treatment liquid dispensed.

Figure 10:
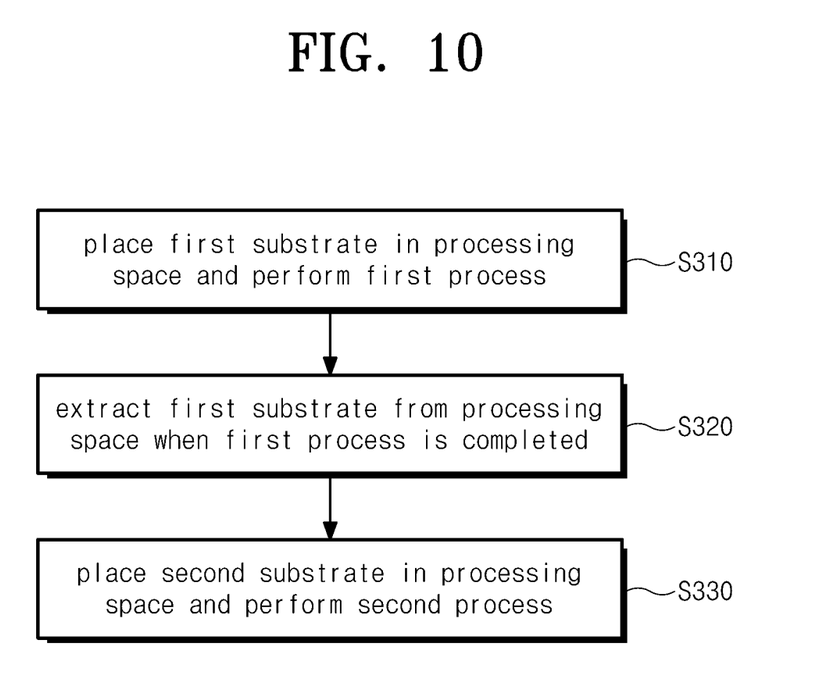
FIG. 10 is another embodiment of the flowchart of FIG. 9 (different substrates in the same chamber).

In the above-described embodiment, the first and second substrates are processed in the different process chambers. However, different types of liquid films may be formed on the first and second substrates in the same process chamber. The coating nozzle 844 may selectively dispense the first coating solution or the second coating solution. As illustrated in FIG. 10, the first substrate is placed in the rear liquid processing chamber 3604, and first process S310 is performed on the first substrate. Thereafter, when the first substrate is extracted from the rear liquid processing chamber 3604 (S320), the second substrate is placed in the rear liquid processing chamber 3604, and second process S330 is performed on the second substrate. As described above, different supply states of downward air flows may be formed while the coating solutions are being dispensed in first process S310 and second process S330.

The above-described embodiments are not limited to the rear liquid processing chamber 3604 and may be applied to processes performed in the front liquid processing chamber 3602.

Referring to again FIGS. 2 and 3, the plurality of buffer chambers 3800 are provided. Some of the buffer chambers 3800 are disposed between the index module 20 and the transfer chamber 3400. Hereinafter, these buffer chambers are referred to as front buffers 3802. The plurality of front buffers 3802 are stacked on each other along the vertical direction. The other buffer chambers are disposed between the transfer chamber 3400 and the interface module 40. Hereinafter, these buffer chambers are referred to as rear buffers 3804. The plurality of rear buffers 3804 are stacked on each other along the vertical direction. The front buffers 3802 and the rear buffers 3804 each temporarily store a plurality of substrates W. The substrates W stored in the front buffers 3802 are extracted by the index robot 2200 and the transfer robot 3422. The substrates W stored in the rear buffers 3804 are extracted by the transfer robot 3422 and a first robot 4602.

Each of the developing blocks 30*b* has heat treatment chambers 3200, a transfer chamber 3400, and liquid processing chambers 3600. The heat treatment chambers 3200, the transfer chamber 3400, and the liquid processing chambers 3600 of the developing block 30*b* are provided in a structure and an arrangement similar to the structure and the arrangement of the heat treatment chambers 3200, the transfer chamber 3400, and the liquid processing chambers 3600 of the coating block 30*a*. Therefore, detailed descriptions thereabout will be omitted. However, the liquid processing chambers 3600 in the developing block 30*b* are implemented as developing chambers 3600 that perform a developing process on a substrate by identically dispensing a developing solution onto the substrate.

The interface module 40 connects the processing module 30 to an external stepper 50. The interface module 40 has an interface frame 4100, additional process chambers 4200, interface buffers 4400, and a transfer member 4600.

The interface frame 4100 may have a fan filter unit at the top thereof, which forms a downward flow of air in the interface frame 4100. The additional process chambers 4200, the interface buffers 4400, and the transfer member 4600 are disposed in the interface frame 4100. The additional process chambers 4200 may perform a predetermined additional process on a substrate W processed in the coating block 30*a* before the substrate W is transferred to the stepper 50. Alternatively, the additional process chambers 4200 may perform a predetermined additional process on a substrate W processed in the stepper 50 before the substrate W is transferred to the developing block 30*b*. According to an embodiment, the additional process may be an edge exposing process of exposing the edge region of the substrate W to light, a front-side cleaning process of cleaning the front side of the substrate W, or a back-side cleaning process of cleaning the back side of the substrate W. The plurality of additional process chambers 4200 may be stacked on each other. The additional process chambers 4200 may all perform the same process. Alternatively, some of the additional process chambers 4200 may perform different processes.

The interface buffers 4400 provide a space in which substrates W transferred between the coating blocks 30*a*, the additional process chambers 4200, the stepper 50, and the developing blocks 30*b* temporarily stay. The plurality of interface buffers 4400 may be stacked on each other.

According to an embodiment, the additional process chambers 4200 may be disposed on one side of an extension line oriented in the longitudinal direction of the transfer chamber 3400, and the interface buffers 4400 may be disposed on the other side of the extension line.

The transfer member 4600 transfers substrates W between the coating blocks 30*a*, the additional process chambers 4200, the stepper 50, and the developing blocks 30*b*. The transfer member 4600 may be implemented with one or more robots. According to an embodiment, the transfer member 4600 has the first robot 4602 and a second robot 4606. The first robot 4602 may transfer substrates W between the coating blocks 30*a*, the additional process chambers 4200, and the interface buffers 4400, an interface robot may transfer substrates W between the interface buffers 4400 and the stepper 50, and the second robot 4606 may transfer substrates W between the interface buffers 4400 and the developing blocks 30*b*.

The first robot 4602 and the second robot 4606 each include a hand on which a substrate W is placed, and the hand is movable forward and backward, rotatable about an axis parallel to the third direction 16, and movable along the third direction 16.

The hands of the index robot 2200, the first robot 4602, and the second robot 4606 may all have the same shape as the hand 3420 of the transfer robot 3422. Alternatively, the hand of a robot that directly exchanges a substrate W with the transfer plate 3240 of each of the heat treatment chambers 3200 may have the same shape as the hand 3420 of the transfer robot 3422, and the hands of the remaining robots may have different shapes from the hand 3420 of the transfer robot 3422.

According to an embodiment, the index robot 2200 may directly exchange substrates W with the heating units 3230 of the front heat treatment chambers 3200 in the coating blocks 30*a*.

Furthermore, the transfer robots 3422 in the coating blocks 30*a* and the developing blocks 30*b* may directly exchange substrates W with the transfer plates 3240 located in the heat treatment chambers 3200.

Next, an embodiment of a method for processing a substrate using the above-described substrate processing apparatus 1 will be described.

Coating process S20, edge exposing process S40, exposing process S60, and developing process S80 are sequentially performed on a substrate W.

Coating process S20 is performed by sequentially performing heat treatment process S21 in the heat treatment chamber 3200, anti-reflection film coating process S22 in the front liquid processing chamber 3602, heat treatment process S23 in the heat treatment chamber 3200, photoresist film coating process S24 in the rear liquid processing chamber 3604, and heat treatment process S25 in the heat treatment chamber 3200.

Hereinafter, an example of a transfer path of a substrate W from the container 10 to the stepper 50 will be described.

The index robot 2200 extracts the substrate W from the container 10 and transfers the substrate W to the front buffer 3802. The transfer robot 3422 transfers the substrate W stored in the front buffer 3802 to the front heat treatment chamber 3200. The substrate W is transferred to the heating unit 3230 by the transfer plate 3240. When a heating process is completely performed on the substrate W in the heating unit 3230, the transfer plate 3240 transfers the substrate W to the cooling unit 3220. The transfer plate 3240 is brought into contact with the cooling unit 3220 and performs a cooling process on the substrate W supported on the transfer plate 3240. When the cooling process is completed, the transfer plate 3240 moves above the cooling unit 3220, and the transfer robot 3422 extracts the substrate W from the heat treatment chamber 3200 and transfers the substrate W to the front liquid processing chamber 3602.

The front liquid processing chamber 3602 coats the substrate W with an anti-reflection film.

The transfer robot 3422 extracts the substrate W from the front liquid processing chamber 3602 and places the substrate W in the heat treatment chamber 3200. The heat treatment chamber 3200 sequentially performs the above-described heating and cooling processes. When the heat treatment processes are completed, the transfer robot 3422 extracts the substrate W from the heat treatment chamber 3200 and places the substrate W in the rear liquid processing chamber 3604.

Thereafter, the rear liquid processing chamber 3604 coats the substrate W with a photoresist film.

The transfer robot 3422 extracts the substrate W from the rear liquid processing chamber 3604 and places the substrate W in the heat treatment chamber 3200. The heat treatment chamber 3200 sequentially performs the above-described heating and cooling processes. When the heat treatment processes are completed, the transfer robot 3422 transfers the substrate W to the rear buffer 3804. The first robot 4602 of the interface module 40 extracts the substrate W from the rear buffer 3804 and transfers the substrate W to the additional process chamber 4200.

The additional process chamber 4200 performs an edge exposing process on the substrate W.

The first robot 4602 extracts the substrate W from the additional process chamber 4200 and transfers the substrate W to the interface buffer 4400.

The second robot 4606 extracts the substrate W from the interface buffer 4400 and transfers the substrate W to the stepper 50.

Developing process S80 is performed by sequentially performing heat treatment process S81 in the heat treatment chamber 3200, developing process S82 in the liquid processing chamber 3600, and heat treatment process S83 in the heat treatment chamber 3200.

Hereinafter, an example of a transfer path of the substrate W from the stepper 50 to the container 10 will be described.

The second robot 4606 extracts the substrate W from the stepper 50 and transfers the substrate W to the interface buffer 4400.

The first robot 4602 extracts the substrate W from the interface buffer 4400 and transfers the substrate W to the rear buffer 3804. The transfer robot 3422 extracts the substrate W from the rear buffer 3804 and transfers the substrate W to the heat treatment chamber 3200. The heat treatment chamber 3200 sequentially performs a heating process and a cooling process on the substrate W. When the cooling process is completed, the substrate W is transferred to the developing chamber 3600 by the transfer robot 3422.

The developing chamber 3600 performs a developing process by dispensing a developing solution onto the substrate W.

The substrate W is extracted from the developing chamber 3600 and placed in the heat treatment chamber 3200 by the transfer robot 3422. The heat treatment chamber 3200 sequentially performs a heating process and a cooling process on the substrate W. When the cooling process is completed, the substrate W is extracted from the heat treatment chamber 3200 and transferred to the front buffer 3802 by the transfer robot 3422.

The index robot 2200 extracts the substrate W from the front buffer 3802 and transfers the substrate W to the container 10.

The processing module 30 of the substrate processing apparatus 1 has been described as performing the coating process and the developing process. However, the substrate processing apparatus 1 may include only the index module 20 and the processing module 30 without the interface module 40. In this case, the processing module 30 may perform only the coating process, and a film with which a substrate W is coated may be a spin-on hardmask (SOH) film.

According to the embodiments of the inventive concept, a supply state of a downward air flow is adjusted according to the amount of pre-treatment liquid dispensed, and thus the thickness of a liquid film may be uniformly adjusted.

In addition, according to the embodiments of the inventive concept, even though different types of liquid films are formed on a plurality of substrates, supply states of downward air flows are adjusted according to the amounts of pre-treatment liquids dispensed onto the substrates, and thus the liquid films may be formed on the plurality of substrates to the same thickness.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for forming a liquid film on a substrate, the apparatus comprising:
   a first process chamber having a first space in which a first substrate is processed;
   a second process chamber having a second space in which a second substrate is processed;
   liquid dispensing units provided in the first and second process chambers and configured to dispense processing liquids to form liquid films on the first and second substrates, respectively;
   air-flow supply units provided in the first and second process chambers and configured to form downward air flows in the first and second spaces, respectively; and
   a controller configured to control the liquid dispensing units and the air-flow supply units,
   wherein the liquid dispensing unit provided in the first process chamber includes:
      a first pre-treatment nozzle configured to dispense a pre-treatment liquid onto the first substrate; and
      a first coating solution nozzle configured to dispense a coating solution onto the first substrate,
   wherein the liquid dispensing unit provided in the second process chamber includes:
      a second pre-treatment nozzle configured to dispense a pre-treatment liquid onto the second substrate; and
      a second coating solution nozzle configured to dispense a coating solution onto the second substrate,
   wherein the controller is configured to control the first pre-treatment nozzle and the second pre-treatment nozzle so that an amount of the pre-treatment liquid supplied to the first substrate is different from an amount of the pre-treatment liquid supplied to the second substrate,
   wherein the controller is configured to control the air-flow supply units so that a speed of the downward air flow formed in the first space when the coating solution is supplied to the first substrate and a speed of the downward air flow formed in the second space when the coating solution is supplied to the second substrate are different,
   wherein the speed of the downward air flow formed in the first space is determined by the amount of the pre-treatment liquid supplied to the first substrate,
   wherein the speed of the downward air flow formed in the second space is determined by the amount of the pre-treatment liquid supplied to the second substrate,
   wherein the controller is configured to control the speed of the downward air flow to be decreased with an increase in the amount of pre-treatment liquid dispensed, and
   wherein the controller is configured to control the speed of the downward air flow to be increased with a decrease in the amount of pre-treatment liquid dispensed.

2. The apparatus of claim 1, wherein the first pre-treatment nozzle dispenses a first amount of pre-treatment liquid onto the first substrate, and the controller forms the downward air flow with a first speed in the first space,
   wherein the second pre-treatment nozzle dispenses a second amount of pre-treatment liquid-onto the second substrate, and the controller forms the downward air flow with a second speed in the second space, and
   wherein the first amount is greater than the second amount, and the first speed is lower than the second speed.

3. The apparatus of claim 2, wherein the pre-treatment liquids include a solvent, and
   wherein the coating solutions dispensed onto the first and second substrates are different types of liquids.

4. The apparatus of claim 1, wherein each of the air-flow supply units includes:
   an air-flow supply line connected to a ceiling surface of a corresponding one of the first and second process chambers; and
   a fan installed in the air-flow supply line, and
   wherein the controller controls rotational speeds of the fans to adjust the supply states of the downward air flows.

* * * * *